United States Patent
Taya

(10) Patent No.: US 11,061,074 B2
(45) Date of Patent: Jul. 13, 2021

(54) BATTERY MEASUREMENT DEVICE AND BATTERY MONITORING SYSTEM

(71) Applicant: LAPIS Semiconductor Co., Ltd., Yokohama (JP)

(72) Inventor: Takashi Taya, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 219 days.

(21) Appl. No.: 16/174,271

(22) Filed: Oct. 29, 2018

(65) Prior Publication Data

US 2019/0128970 A1    May 2, 2019

(30) Foreign Application Priority Data

Oct. 30, 2017    (JP) .............................. JP2017-209769

(51) Int. Cl.
*G01R 31/36* (2020.01)
*G01R 31/371* (2019.01)
*G01R 31/396* (2019.01)

(52) U.S. Cl.
CPC ......... *G01R 31/371* (2019.01); *G01R 31/396* (2019.01)

(58) Field of Classification Search
CPC . G01R 31/371; G01R 31/396; G01R 31/3835
See application file for complete search history.

(56) References Cited

U.S. PATENT DOCUMENTS

| 8,773,405 B1* | 7/2014 | Ryshtun | G06F 3/038 345/179 |
| 2015/0061688 A1* | 3/2015 | Loftus | B60L 3/0069 324/509 |
| 2015/0177302 A1* | 6/2015 | Lu | G01R 29/0857 324/72 |
| 2019/0204393 A1* | 7/2019 | Yamada | H02J 7/0021 |

FOREIGN PATENT DOCUMENTS

JP    2016-096082 A    5/2016

* cited by examiner

*Primary Examiner* — Christopher P McAndrew
*Assistant Examiner* — Zannatul Ferdous
(74) *Attorney, Agent, or Firm* — Rabin & Berdo, P.C.

(57) ABSTRACT

A battery measurement device has an input terminal that receives a voltage of a secondary battery, a measurement circuit that measures a voltage value of a voltage received by the input terminal and generates a measurement information signal representing measurement results, a transmission unit that wirelessly transmits the measurement information signal, and a power source circuit that generates a power source voltage having a prescribed voltage value on the basis of the voltage of the input terminal, and supplies the power source voltage to the measurement circuit and the transmission unit.

12 Claims, 11 Drawing Sheets

BATTERY MEASUREMENT DEVICE AND BATTERY MONITORING SYSTEM

BACKGROUND OF THE INVENTION

The present invention relates to a battery measurement device that measures the state of a battery, and to a battery monitoring system that monitors the battery on the basis of measurement results.

Storage battery units in which battery modules that house electrochemical cells (hereinafter referred to as battery cells) such as lithium ion secondary batteries are stacked, for example, have been proposed as direct current power supplies (see Japanese Patent Application Laid-Open Publication No. 2016-96082, for example). In such storage battery units, a power source voltage having a desired voltage value is generated by connecting the battery cells housed in the battery module in series or in parallel.

SUMMARY

However, if such a storage battery unit is used as a power source to drive a driving motor of an electric vehicle, then the storage battery unit enters a discharge state while the vehicle is being driven, and enters a charging state during braking as a result of regenerative braking. Thus, as a result of charging and discharging being frequently repeated, the voltage, charge state, or the like of the battery cells included in the storage battery unit changes over time. Also, there is variation in the change in state among the battery cells. Thus, there is a need to use a battery management device in order to monitor the voltage and temperature or the charge state of each of the battery cells, and control the charging and discharging of each of the battery cells individually in the storage battery unit on the basis of the monitoring results.

In order to attain a high voltage of several hundred volts to drive a driving motor of an electric vehicle, a storage battery unit in which a plurality of 3.7 volt battery cells are connected in series can be used, for example. In such a case, the battery cells are connected in series, and thus, the potential of the battery cells ranges from the potential of each individual battery cell to the high potential supplied to the driving motor (several hundred volts).

Thus, in addition to cables that transmit such high potentials, a high voltage semiconductor element, isolation transformer, photocoupler, or the like that converts such a high potential to a signal level that can be handled by a battery management device is needed.

Thus, there is a problem of increased overall size of the device as well as an increase in power consumption.

An object of the present invention is to provide a battery measurement device and a battery monitoring system by which it is possible to reduce the overall size of the device without resulting in an increase in power consumption.

A battery measurement device according to an embodiment of the present invention includes: an input terminal that receives a voltage of a secondary battery; a measurement circuit that measures a voltage value of the voltage received by the input terminal, and generates a measurement information signal representing measurement results; a transmission unit that wirelessly transmits the measurement information signal; and a power source circuit that generates a power source voltage having a prescribed voltage value on the basis of the voltage of the input terminal, and supplies the power source voltage to the measurement circuit and the transmission unit.

A battery monitoring system according to an embodiment of the present invention is a battery monitoring system, including: a battery management device that monitors a state of first to nth (n being an integer of 2 or greater) secondary batteries that are connected in series; first to nth measurement/communication circuits that measure voltage values of the first to nth secondary batteries, generate first to nth measurement information signals individually representing measurement results, and generate first to nth modulation signals corresponding to the first to nth measurement information signals; first to nth coil antennas that emit high frequency magnetic fields corresponding to each of the first to nth modulation signals; relay coil antennas that receive high frequency magnetic fields and attain reception signals corresponding to the first to nth modulation signals; and a communication relay circuit that acquires the first to nth measurement information signals from the reception signals and supplies the first to nth measurement information signals to the battery management device, wherein each of the measurement/communication circuits has: an input terminal that receives a voltage of the secondary battery; a measurement circuit that measures a voltage value of the voltage received by the input terminal, and generates the measurement information signal representing measurement results; a transmission unit that generates the modulation signal generated by modulating a carrier wave signal using the measurement information signal; and a first power source circuit that generates a first power source voltage having a prescribed voltage value on the basis of the voltage of the input terminal, and supplies the first power source voltage to the measurement circuit and the transmission unit.

In an embodiment of the present invention, the voltage of secondary batteries is measured and a measurement information signal indicating the measurement results thereof is wirelessly transmitted, and thus, the direct current voltage generated by the secondary batteries themselves is not applied to the battery management device. Thus, when measuring the voltage of the plurality of secondary batteries that are connected in series in order to attain a high voltage, there is no need for a cable for transmitting a high voltage. Additionally, relatively expensive and large parts such as a high voltage semiconductor element, isolation transformer, or photocoupler are unnecessary as parts for converting a voltage generated by the batteries to a signal representing the voltage value of this voltage.

Also, the magnetic field coupling mode is used as the wireless communication mode for wirelessly transmitting the measurement information signal, and a power source circuit that generates a power source voltage necessary for communication and an oscillation circuit that generates a clock signal are provided in a device for performing the above-mentioned measurement and communication. As a result, there is no need to transmit power by magnetic field coupling or to transmit a synchronizing signal for generating the clock signal.

Thus, for the modulation mode for communication, not only can ASK (amplitude-shift keying) be used, but PSK (phase-shift keying), FSK (frequency-shift keying), or the like that changes the frequency can be used. Also, compared to a case in which transmission of the measurement information signal by magnetic field coupling, power transmission, and transmission of a synchronizing signal are performed, it is possible to establish a desired communication distance even if the intensity of the emitted magnetic field is weakened.

Thus, according to an embodiment of the present invention, it is possible to measure the voltage of the secondary batteries while reducing the overall size of the device and without increasing power consumption.

DETAILED DESCRIPTION OF EMBODIMENTS

An embodiment of the present invention will be explained in detail below with reference to the drawings.

Figure 1:
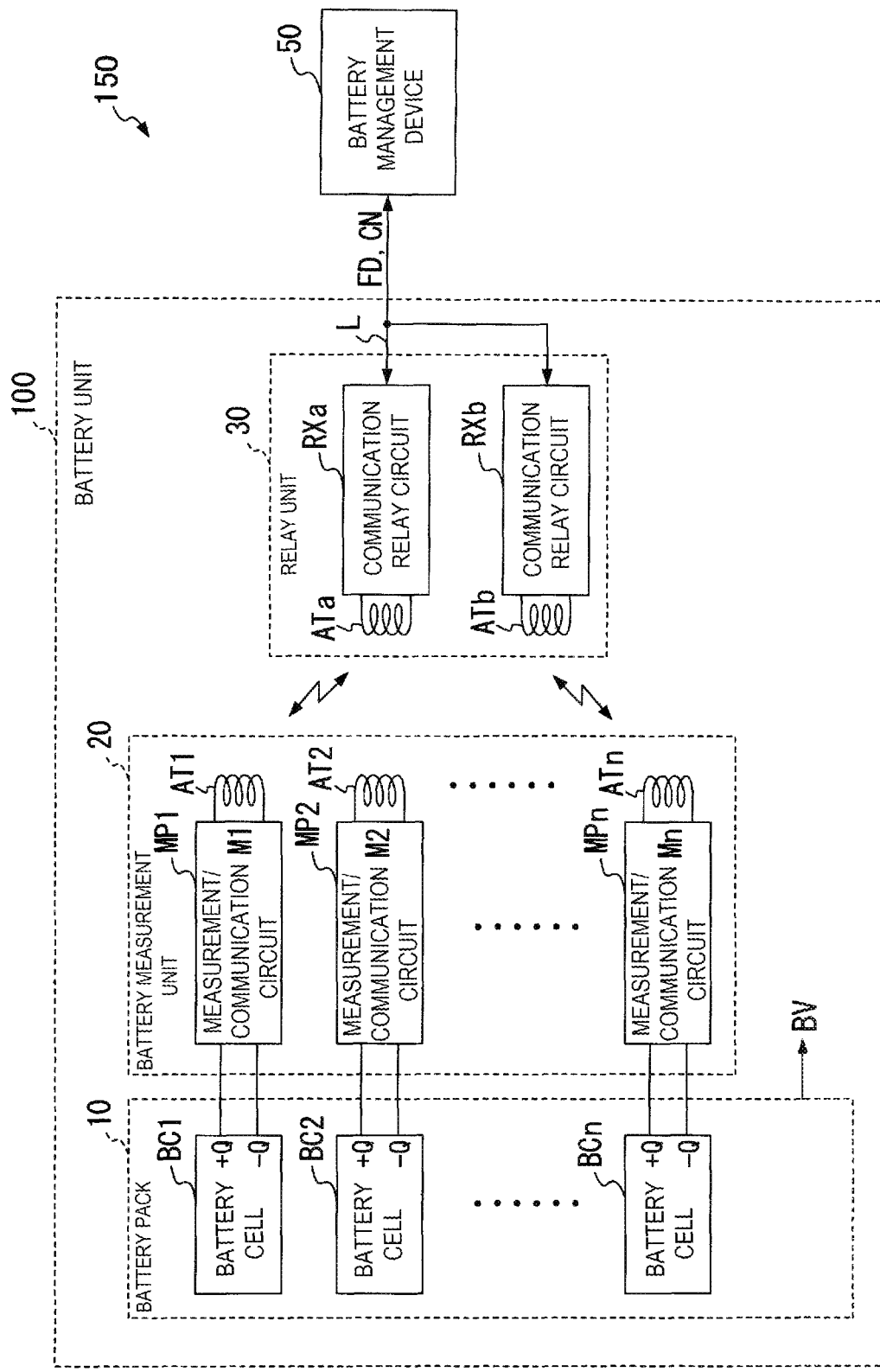
FIG. 1 is a block diagram showing a configuration of a battery monitoring system 150 including a battery measurement device according to an embodiment of the present invention.

FIG. 1 is a block diagram showing a configuration of a battery monitoring system 150 including a battery measurement device according to an embodiment of the present invention.

the battery monitoring system 150 may be installed in an electric vehicle or a hybrid vehicle, for example. The battery monitoring system 150 has a battery unit 100 and a battery management device 50 that manages the state of the battery unit 100.

The battery unit 100 includes a battery pack 10, a battery measurement unit 20, and a relay unit 30.

The battery pack 10 outputs a battery voltage BV as a voltage to drive a driving motor of an electric vehicle or a hybrid vehicle, for example.

The battery pack 10 houses a plurality of battery cells BC1 to BCn (n being an integer of 2 or greater). Each of the battery cells BC1 to BCn is a secondary battery that generates a predetermined voltage, such as a direct current voltage of 3.7 volts, for example, and outputs the voltage through a positive electrode terminal +Q and a negative electrode terminal −Q. The battery cells BC1 to BCn are connected to each other in series in the battery pack 10. That is, the positive electrode terminal +Q of the battery cell BCr (r being an integer of 2 to n−1) is connected to the negative electrode terminal −Q of the battery cell BC(r−1), and the negative electrode terminal −Q of the battery cell BCr is connected to the positive electrode terminal +Q of the battery cell BC(r+1).

The battery pack 10 generates the battery voltage BV as a voltage formed by combining the direct current voltages generated by the battery cells BC1 to BCn.

As shown in FIG. 1, the battery measurement unit 20 includes measurement/communication circuits MP1 to MPn and coil antennas AT1 to ATn provided for each of the battery cells BC1 to BCn.

The measurement/communication circuit MP1 acquires a control information signal by performing a demodulation process on a reception signal corresponding to a high frequency magnetic field received by the coil antenna AT1. The measurement/communication circuit MP1 measures the voltage, current, or temperature of the battery cell BC1 through the positive electrode terminal +Q and the negative electrode terminal −Q of the battery cell BC1 according to the acquired control information signal, and generates a measurement information signal indicating the measurement results (voltage, current, temperature, etc.).

Additionally, the measurement/communication circuit MP1 supplies, to the coil antenna AT1, a modulation signal M1 formed by modulating a carrier wave signal using the measurement information signal. The coil antenna AT1 emits a high frequency magnetic field corresponding to the modulation signal M1.

Similarly, the measurement/communication circuit MPr (r being an integer of 2 to n) acquires a control information signal by performing a demodulation process on a reception signal corresponding to a high frequency magnetic field received by the coil antenna ATr. The measurement/communication circuit MPr measures the voltage, current, or temperature of the battery cell BCr through the positive electrode terminal +Q and the negative electrode terminal −Q of the battery cell BCr according to the acquired control information signal. Additionally, the measurement/communication circuit MPr supplies, to the coil antenna ATr, a modulation signal M1 formed by modulating a carrier wave signal using the measurement information signal representing the measurement results (voltage, current, temperature, etc.). The coil antenna ATr emits a high frequency magnetic field corresponding to the modulation signal Mr.

According to this configuration, the battery measurement unit 20 measures the state (voltage, current, temperature) of each individual battery cell BC1 to BCn according to the received control information signal, and wirelessly transmits the measurement information signal indicating the measurement results for each battery cell to the relay unit 30 using a high frequency magnetic field.

The relay unit 30 has a first communication unit including a communication relay circuit RXa and a relay coil antenna ATa, and a second communication unit including a communication relay circuit RXb and a relay coil antenna ATb. The relay unit 30 performs communication relay between the battery measurement unit 20 and the battery management device 50, with either one of the first communication unit (RXa, ATa) and the second communication unit (RXb, ATb) being operational and the other being on standby.

That is, during normal operation, the first communication unit (RXa, ATa) emits a high frequency magnetic field corresponding to a control information signal CN received from the battery management device 50 through a wiring line L, for example. As a result, the first communication unit (RXa, ATa) wirelessly transmits the control information signal CN to the battery measurement unit 20. Also, during normal operation, the first communication unit (RXa, ATa) receives the high frequency magnetic field emitted by the battery measurement unit 20, and supplies a measurement information signal FD represented by the high frequency magnetic field to the battery management device 50 through the wiring line L.

If a fault occurs in the first communication unit (RXa, ATa), then the second communication unit (RXb, ATb), in place of the first communication unit (RXa, ATa), performs a communication operation similar to that of the aforementioned first communication unit (RXa, ATa).

The battery management device 50 monitors the current state of the battery cells BC1 to BCn on the basis of the measurement information signal FD received through the wiring line L. The battery management device 50 monitors the remaining capacity and charge state of the battery cells BC1 to BCn, detects battery cells that have undergone an operational defect, or the like on the basis of the measurement information signal FD, and generates a battery state information signal representing the results thereof, for example.

Also, the battery management device 50 generates the control information signal CN for controlling each of the measurement/communication circuits MP1 to MPn of the battery measurement unit 20, and supplies these to the relay unit 30 through the wiring line L. The control information signal CN includes a measurement command to prompt execution or stoppage of measurement, a transmission request to prompt transmission of the measurement information signal, and an identification number designating the measurement/communication circuit to be controlled from among the measurement/communication circuits MP1 to MPn, for example.

Additionally, the battery management device 50 performs charge/discharge control that instructs charging or discharging of a charge/discharge unit (not shown) that charges or discharges the battery cells BC1 to BCn.

Next, the internal configuration of the measurement/communication circuits MP1 to MPn will be described.

The measurement/communication circuits MP1 to MPn have the same internal configuration. Thus, the internal configuration of only the measurement/communication circuit MP1 will be described below from among the measurement/communication circuits MP1 to MPn.

Figure 2:
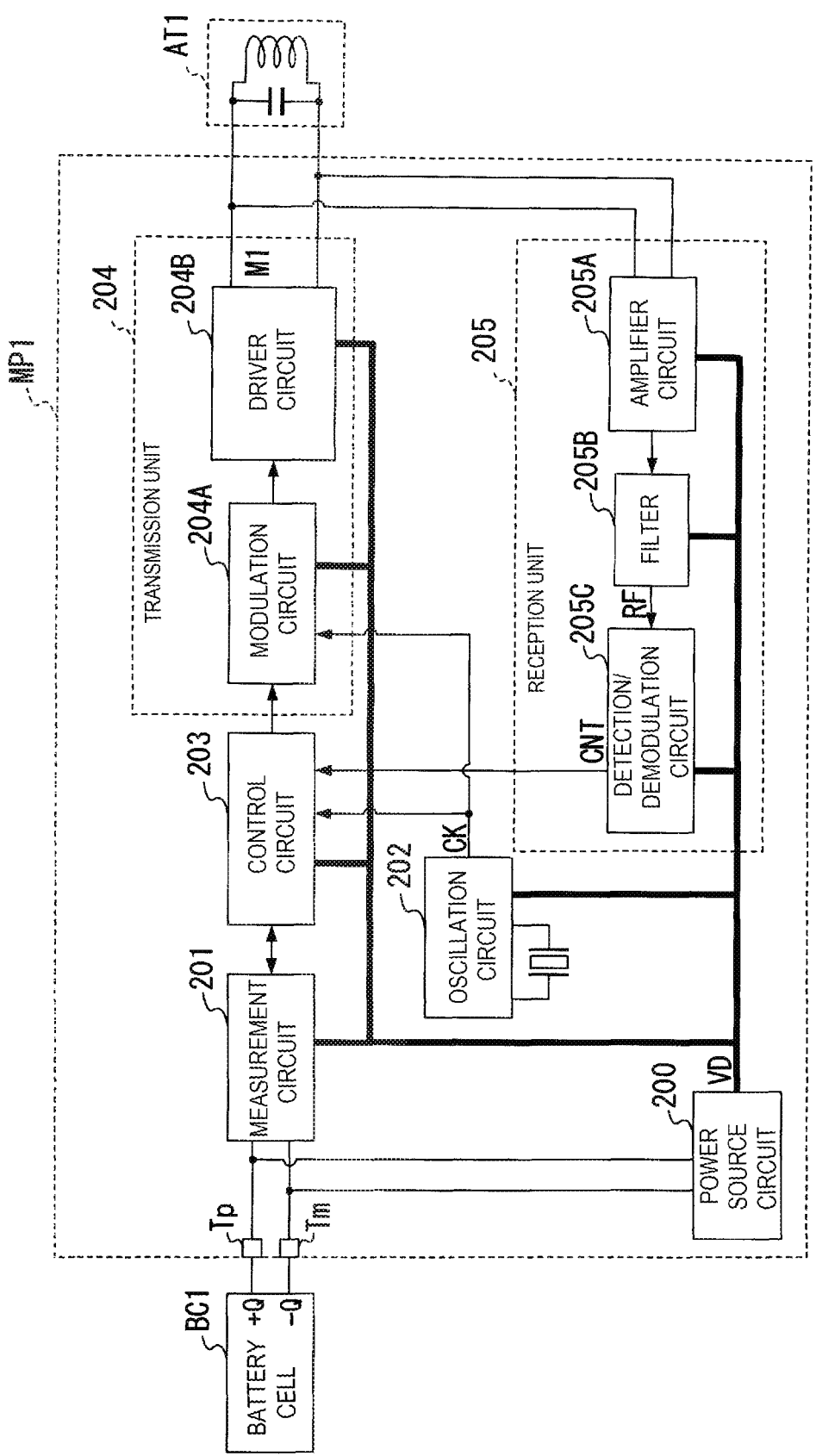
FIG. 2 is a block diagram showing the internal configuration of a measurement/communication circuit MP1.

FIG. 2 is a block diagram showing the internal configuration of the measurement/communication circuit MP1.

In FIG. 2, the measurement/communication circuit MP1 includes input terminals Tp and Tm, a power source circuit 200, a measurement circuit 201, an oscillation circuit 202, a control circuit 203, a transmission unit 204, and a reception unit 205.

The input terminals Tp and Tm receive a voltage generated by the battery cell BC1 through the positive electrode terminal +Q and the negative electrode terminal −Q of the battery cell BC1.

The power source circuit 200 generates a power source voltage VD to operate the internal circuitry on the basis of the voltage of the battery cell BC1 received through the input terminals Tp and Tm. The power source circuit 200 supplies the power source voltage VD to the measurement circuit 201, the oscillation circuit 202, the control circuit 203, the transmission unit 204, and the reception unit 205.

The measurement circuit 201, the oscillation circuit 202, the control circuit 203, the transmission unit 204, and the reception unit 205 perform the following operations by receiving the power source voltage VD.

If the measurement command supplied from the control circuit 203 instructs execution of measurement, the measurement circuit 201 measures the voltage value and current value on the basis of the voltage of the battery cell BC1 received through the input terminals Tp and Tm. Additionally, the measurement circuit 201 measures the heat generated by the battery cell BC1. The measurement circuit 201 supplies the measurement information signal representing the measurement results (voltage, current, temperature) to the control circuit 203.

The oscillation circuit 202 includes a crystal oscillator, for example, that generates an oscillation signal by oscillating in response to the power source voltage VD. The oscillation circuit 202 generates a clock signal CK on the basis of the oscillation signal, and supplies the clock signal to the control circuit 203 and the transmission unit 204.

The control circuit 203 supplies a measurement command to the measurement circuit 201 on the basis of the control information signal CNT supplied from the reception unit 205. If the control information signal CNT represents a transmission request, the control circuit 203 supplies the measurement information signal supplied from the measurement circuit 201 to the transmission unit 204 at a timing synchronized to the clock signal CK.

The transmission unit 204 includes the following modulation circuit 204A and driver circuit 204B.

The modulation circuit 204A has a frequency of 13.56 MHz designated for NFC (near-field communication), and generates a carrier wave signal in phase synchronization with the clock signal CK, for example. Additionally, the modulation circuit 204A supplies to the driver circuit 204B a modulation signal attained by performing amplitude modulation or so-called ASK (amplitude-shift keying) on the carrier wave signal using the measurement information signal supplied from the control circuit 203.

The driver circuit 204B supplies to the coil antenna AT1 the modulation signal M1 generated by amplifying the modulation signal supplied from the modulation circuit 204A.

The coil antenna AT1 includes a resonance capacitor connected to both ends of the coil antenna. The coil antenna AT1 emits a high frequency magnetic field based on the modulation signal M1. Also, if the coil antenna AT1 receives a high frequency magnetic field that is a wireless transmission wave emitted by the relay unit 30, it supplies a reception signal corresponding to the high frequency magnetic field to the reception unit 205.

The reception unit 205 includes the following amplifier circuit 205A, filter 205B, and detection/demodulation circuit 205C.

The amplifier circuit 205A supplies to the filter 205B an amplified reception signal generated by amplifying the reception signal.

The filter 205B is an active filter such as a transversal filter, for example, that generates a reception signal RF by eliminating noise and interference from the amplified reception signal, and supplies the reception signal to the detection/demodulation circuit 205C.

The detection/demodulation circuit 205C performs envelope detection on the reception signal RF or performs a demodulation process of multiplying the reception signal RF by the carrier wave signal. As a result, the detection/demodulation circuit 205C acquires the control information signal CNT corresponding to the control information signal CN generated by the battery management device 50, and supplies the control information signal to the control circuit 203.

Next, the internal configuration of the communication relay circuits RXa and RXb shown in FIG. 1 will be described.

The communication relay circuits RXa and RXb have the same internal configuration. Thus, the internal configuration of only the measurement/communication circuit RXa will be described below.

Figure 3:
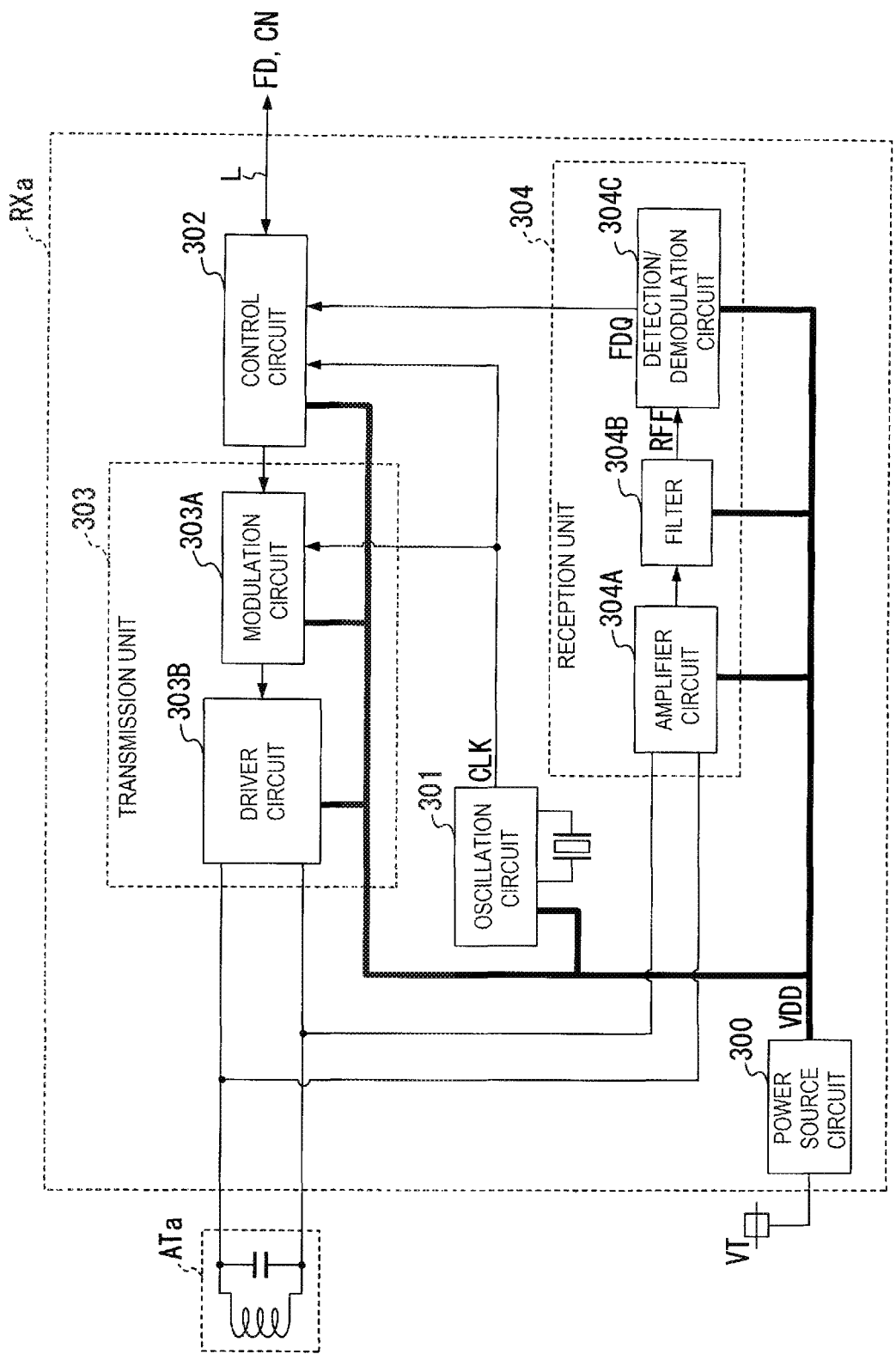
FIG. 3 is a block diagram showing the internal configuration of a communication relay circuit RXa.

FIG. 3 is a block diagram showing the internal configuration of the communication relay circuit RXa.

In FIG. 3, the power source circuit 300 receives as an external voltage VT a voltage for an accessory used in a navigation device, an audio device, or the like installed in the vehicle, for example, and generates a power source voltage VDD having a prescribed voltage value for operating the internal circuitry on the basis of the external voltage VT. The power source circuit 300 supplies the power source voltage VDD to the oscillation circuit 301, the control circuit 302, the transmission unit 303, and the reception unit 304.

The oscillation circuit 301 includes a crystal oscillator, for example, that generates an oscillation signal by oscillating in response to the power source voltage VDD. The oscillation circuit 301 generates a clock signal CLK on the basis of the oscillation signal, and supplies the clock signal to the control circuit 302 and the transmission unit 303.

The control circuit 302 receives the control information signal CN supplied from the battery management device 50 through the wiring line L, and supplies to the transmission unit 303 a control information signal formed by synchronizing the control information signal CN to the clock signal CLK. Also, the control circuit 302 receives a measurement information signal FDQ supplied from the reception unit 304, and supplies to the battery management device 50 the measurement information signal FD formed by synchronizing the measurement information signal FDQ to the clock signal CLK, through the wiring line L.

The transmission unit 303 includes the following modulation circuit 303A and driver circuit 303B.

The modulation circuit 303A has a frequency of 13.56 MHz designated for NFC, and generates a carrier wave signal in phase synchronization with the clock signal CLK, for example. Additionally, the modulation circuit 303A supplies to the driver circuit 303B a modulation signal attained by performing amplitude modulation or so-called ASK (amplitude shift keying) on the above-mentioned carrier wave signal using the measurement information signal FDQ supplied from the control circuit 302.

The driver circuit 303B supplies to the relay coil antenna ATa an amplified modulation signal generated by amplifying the modulation signal supplied from the modulation circuit 303A.

The relay coil antenna ATa includes a resonance capacitor connected to both ends of the coil antenna. The relay coil antenna ATa emits a high frequency magnetic field based on the amplified modulation signal. Also, if the relay coil antenna ATa receives a high frequency magnetic field that is a wireless transmission wave emitted by the battery measurement unit 20, it supplies a reception signal corresponding to the high frequency magnetic field to the reception unit 304.

The reception unit 304 includes the following amplifier circuit 304A, filter 304B, and detection/demodulation circuit 304C.

The amplifier circuit 304A supplies an amplified reception signal generated by amplifying the reception signal to the filter 304B.

The filter 304B is an active filter such as a transversal filter, for example, that supplies, to the detection/demodulation circuit 304C, a reception signal RFF generated by eliminating noise and interference from the amplified reception signal.

The detection/demodulation circuit 304C performs envelope detection on the reception signal RFF or performs a demodulation process of multiplying the reception signal RFF by the carrier wave signal, thereby attaining the measurement information signal FDQ corresponding to the measurement information signal generated by the measurement circuit 201 of each of the measurement/communication circuits MP1 to MPn. The detection/demodulation circuit 304C supplies the measurement information signal FDQ to the control circuit 302.

Figure 4:
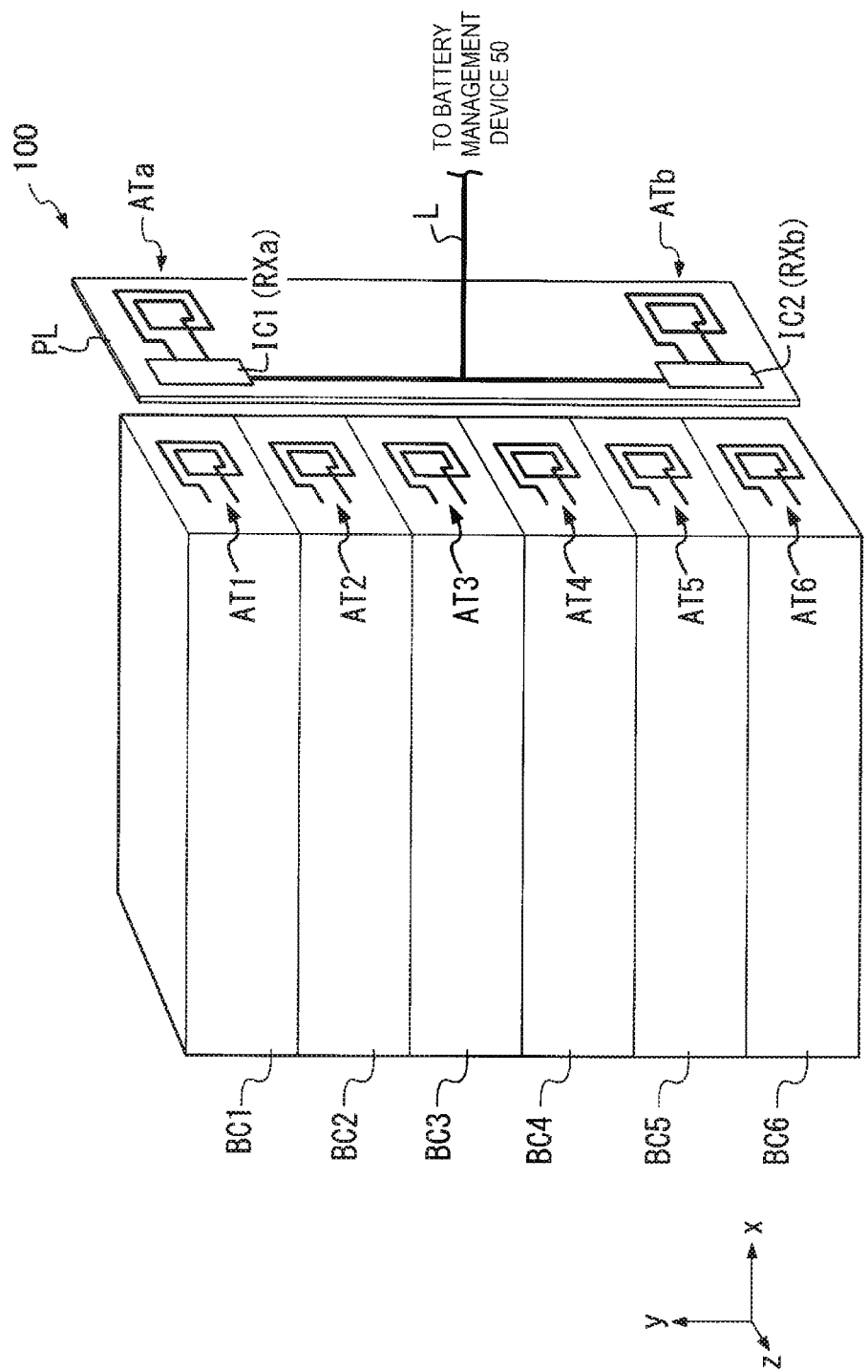
FIG. 4 is a perspective view of the outside of a portion of the internal configuration of a battery unit 100.

FIG. 4 is a perspective view of the outside of a portion of the internal configuration of the battery unit 100. In FIG. 4, a portion of the external form of the battery unit 100 is shown, and specifically, the battery cells BC1 to BC6, the coil antennas AT1 to AT6, the relay coil antennas ATa and ATb, and the communication relay circuits RXa and RXb are shown.

The battery cells BC1 to BC6 each have an overall rectangular cuboid shape, and are stacked in the battery pack 10 as shown in FIG. 4. Among the six surfaces of each battery cell BC, the surface where the battery cells meet or a surface opposite thereto is referred to as the top surface or bottom surface, and the remaining four surfaces are referred to as side surfaces.

In FIG. 4, a coil antenna having a flat spiral pattern such as shown in FIG. 4 is formed as the coil antenna ATt on a side surface corresponding to one of two short sides among the four sides of the top surface (or bottom surface) of the battery cell BCt (t being an integer of 1 to 6).

The measurement/communication circuit MPt (t being an integer of 1 to 6) is formed in the battery cell BCt, and the coil antenna ATr formed on the side surface of the battery cell BCt is connected to the measurement/communication circuit MPt.

Furthermore, inside the battery unit 100, a substrate PL having formed thereon the relay coil antennas ATa and ATb having a flat spiral pattern, a semiconductor chip IC1 including the communication relay circuit RXa, and a semiconductor chip IC2 including the communication relay circuit RXb, are disposed.

The relay coil antennas ATa and ATb are made of metal wiring lines printed on the surface of the substrate PL, for example. The communication relay circuit RXa included in the semiconductor chip IC1 and the communication relay circuit RXb included in the semiconductor chip IC2 are electrically connected, through the wiring line L, to the battery management device 50 provided outside of the battery unit 100.

The substrate PL is disposed in the battery unit 100 in parallel and in close proximity to the surface where the coil antennas AT1 to ATn are formed. That is, inside the battery unit 100, the coil antennas AT1 to ATn and the relay coil antennas ATa and ATb are arranged such that the axial directions thereof are the same. As a result, the antennas (AT1 to AT6, ATa, ATb) are magnetically coupled, and thus, wireless communication between the battery measurement unit 20 and the relay unit 30 as described above is enabled.

As described in detail above, in the battery unit 100 shown in FIGS. 1 to 4, the battery measurement unit 20 measures the voltage, current, and temperature of both ends (+Q, −Q) of each of the battery cells BC1 to BCn separately. The battery measurement unit 20 wirelessly transmits the measurement information signal representing the measurement results for each battery cell to the relay unit 30 disposed in the battery unit 100. The relay unit 30 transmits the wirelessly received measurement information signal to the battery management device 50 through the wiring line L.

As a result, in the battery unit 100, the high voltage generated by the series-connected battery cells BC1 to BCn is not itself transmitted to the battery management device 200, and thus, cables for transmitting such high voltages are unnecessary.

Additionally, in the battery unit 100, relatively expensive and large parts such as a high voltage semiconductor element, isolation transformer, or photocoupler are unnecessary as parts for converting a voltage generated by the battery cells BC1 to BCn to a signal representing the voltage value.

Thus, according to the configuration shown in FIGS. 1 to 4, it is possible to reduce the size of the battery unit 100.

Also, in the battery unit 100, a magnetic field coupling mode based on NFC is adopted as the wireless communication mode between the battery measurement unit 20 and the relay unit 30.

Here, in the battery unit 100, a specialized power source circuit 200 that generates the power source voltage VD and a specialized oscillation circuit 202 that generates the clock signal CK are provided in each of the measurement/communication circuits MP1 to MPn. Furthermore, a specialized power source circuit 300 that generates the power source voltage VDD and a specialized oscillation circuit 301 that generates the clock signal CLK are provided in each of the communication relay circuits RXa and RXb. As a result, when performing wireless communication by magnetic field coupling between the battery measurement unit 20 and the relay unit 30, power transmission by such magnetic field coupling and transmission of a synchronizing signal to be the synchronizing reference for the clock signals is unnecessary.

Thus, compared to a case in which power and a synchronizing signal are wirelessly transmitted together with the measurement information signal by magnetic field coupling, it is possible to establish wireless communication between the measurement/communication circuits MP1 to MPn and the communication relay circuits RXa and RXb with a weaker magnetic field.

Also, power transmission and synchronizing signal transmission are not performed, and thus, it is possible to perform so-called on-off keying in which a carrier wave signal is present while the logic level is 1 and a carrier wave signal is not present while the logic level is 0, as ASK performed by the modulation circuits (204A, 303A). As a result, the communicable range can be widened.

Also, no communication is performed of the synchronizing signal as the reference for clock signal phases, between the battery measurement unit 20 and the relay unit 30, and thus, not only can ASK be adopted as the modulation mode, but PSK (phase-shift keying), FSK (frequency-shift keying), or the like can be used.

Furthermore, in the battery unit 100, specialized power source circuits as described above are provided in each of the measurement/communication circuits MP1 to MPn and communication relay circuits RXa and RXb. Thus, it is possible to provide amplifier circuits (205A, 304A) that amplify the reception signal, and active filters (205B, 304B) that eliminate noise and interference from the reception signal, thereby increasing communication accuracy.

As described above, according to the battery unit 100, it is possible to measure the state of the batteries (voltage, current, temperature, etc.) while reducing the overall size of the device and without increasing power consumption.

In the embodiment above, the measurement/communication circuits MP1 to MPn measure the voltage, current, and temperature of the battery cells BC, which are secondary batteries, but a configuration may be adopted in which only the voltage is measured.

In essence, the battery measurement device (20) should have the following input terminals, measurement circuit, transmission unit, and power source circuit. The measurement circuit (MP) measures the value of the voltage received by the input terminals (Tp, Tm) that receive the voltage of the secondary batteries (BC) and generates the measurement information signal representing the measurement results. The transmission unit (204, AT) wirelessly transmits the measurement information signal. The power source circuit (200) generates the power source voltage (VD) having a prescribed voltage value on the basis of the voltage received by the input terminals, and supplies the power source voltage to the measurement circuit and the transmission unit.

Also, in the above embodiment, either one of the first communication unit (RXa, ATa) and the second communication unit (RXb, ATb) included in the relay unit 30 is set to be operational, with the other being on standby, and typically, only the operational communication unit is operated, but a configuration may be adopted in which both are always in operation.

Below, an example of a communication operation for a case in which both the first communication unit (RXa, ATa) and the second communication unit (RXb, ATb) are operated together will be described as an example shown in FIG. 5 in which there are six battery cells housed in the battery pack 10.

Figure 5:
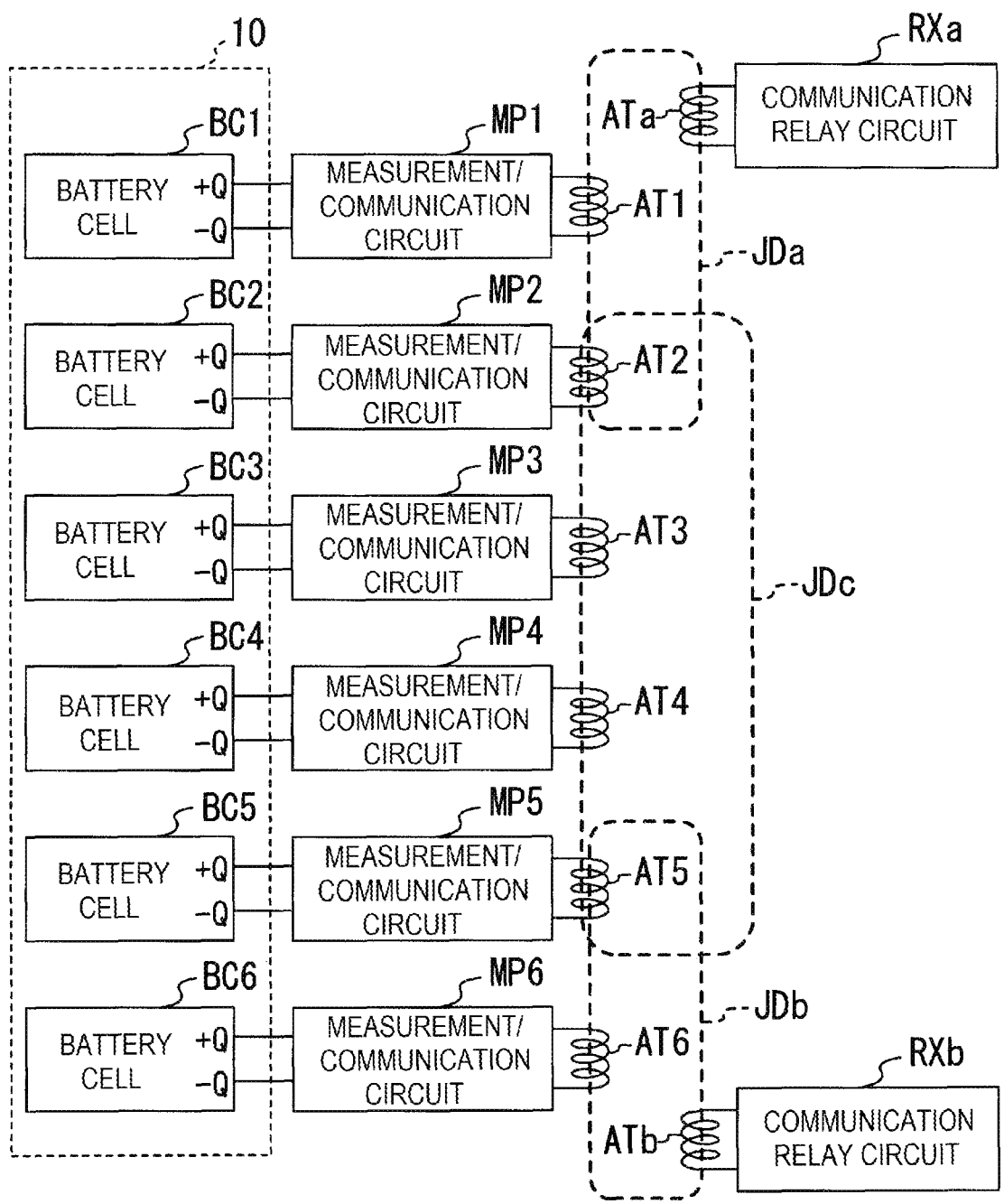
FIG. 5 is a block diagram showing an example of a configuration for describing the communication operation for when dual communication units included in a relay unit 30 are operated together.

In the configuration shown in FIG. 5, the six battery cells BC1 to BC6 are housed in the battery pack 10. Thus, the battery unit 100 includes the battery pack 10, the measurement/communication circuits MP1 to MP6 and coil antennas AT1 to AT6 corresponding to the battery cells BC1 to BC6, the communication relay circuits RXa and RXb, and the relay coil antennas ATa and ATb.

Here, in the configuration shown in FIG. 5, the coil antennas AT1 to AT6 and the relay coil antennas ATa and ATb undergo magnetic field coupling as described below.

That is, as shown in FIG. 5, the coil antennas AT1 and AT2 and the relay coil antenna ATa undergo magnetic field coupling (indicated by "JDa"). Also, the coil antennas AT5 and AT6 and the relay coil antenna ATb undergo magnetic field coupling (indicated by "JDb"). Additionally, the coil antennas AT2 to AT5 undergo magnetic field coupling to each other (indicated by "JDc"). In other words, the relay coil antennas ATa and ATb are disposed in such a position that magnetic field coupling occurs as indicated by JDa to JDc in FIG. 5.

According to this configuration, the measurement information signal of a measurement by the measurement/communication circuit MP1 or MP2 is wirelessly transmitted to the communication relay circuit RXa by the magnetic field coupling (JDa) of the coil antenna AT1 or AT2 and the relay coil antenna ATa. Also, the measurement information signal of a measurement by the measurement/communication circuit MP5 or MP6 is wirelessly transmitted to the communication relay circuit RXb by the magnetic field coupling (JDb) of the coil antenna AT5 or AT6 and the relay coil antenna ATb.

The measurement information signal of a measurement by the measurement/communication circuit MP3 (MP4) is initially wirelessly transmitted to the measurement/communication circuit MP2 (MP5) by the magnetic field coupling (JDc) of the coil antennas AT3 (AT4) and AT2 (AT5). The measurement/communication circuit MP2 (MP5) that has received the measurement information signal continues to wirelessly transmit the measurement information signal to the communication relay circuit RXa (RXb) by the magnetic field coupling of the coil antenna AT2 (AT5) and the relay coil antenna ATa (ATb).

Also, when the communication relay circuit RXb emits from the relay coil antenna ATb a high frequency magnetic field corresponding to the control information signal including a measurement command that prompts execution of measurement on the battery cell BC2, for example, the signal is wirelessly received by the measurement/communication circuit MP5 as a result of the magnetic field coupling (JDb). The measurement/communication circuit MP5 that has received the measurement information signal continues to wirelessly transmit the measurement information signal to the measurement/communication circuit MP2 by the magnetic field coupling (JDc) of the coil antenna AT5 and the coil antenna AT2. In other words, by the magnetic field coupling (JDc) shown in FIG. 5, wireless relay is performed between measurement/communication circuits MP that are separated from each other by a gap equivalent to one battery cell or greater.

As a result, compared to a case in which an information signal is only relayed wirelessly to a desired measurement/communication circuit MP among adjacent measurement/communication circuits MP, it is possible to reduce the time and power consumption required for communication. Also, it is possible to secure a plurality of communication systems for performing relay, and thus, even if a fault were to occur in the communication function of a given measurement/communication circuit MP, for example, wireless communication is enabled through the coil antenna AT connected to the faulty measurement/communication circuit MP. As a result, a high reliability communication system can be configured.

In the example shown in FIG. 5, among the coil antennas AT1 to ATn connected to the measurement/communication circuits MP1 to MPn, the coil antennas that are magnetically coupled to the relay coil antenna ATa (ATb) are assigned the reference characters AT1 and AT2 (AT5 and AT6). However, the number of coil antennas on the side of the measurement/communication circuit magnetically coupled with the relay coil antenna ATa (ATb) is not limited to two, and may be one or three or more.

In essence, the relay coil antenna is disposed in a position where at least one of the first to nth coil antennas (AT1 to ATn) on the side of the measurement/communication circuits (MP1 to MPn) undergoes magnetic field coupling (JDa or JDb) with the relay coil antenna (ATa or ATb). Furthermore, any configuration may be adopted as long as wireless communication between the plurality of measurement/communication circuits connected to the plurality of coil antennas is performed as a result of the magnetic field coupling (JDc) between the plurality of coil antennas including the at least one coil antenna.

Also, in the embodiment above, as shown in FIG. 4, the coil antenna ATt having a flat spiral pattern is formed on a side surface corresponding to one of two short sides among the four sides of the top surface (or bottom surface) of the battery cell BCt (t being an integer of 1 to 6) but the coil antenna may be formed on another surface.

Figure 6:
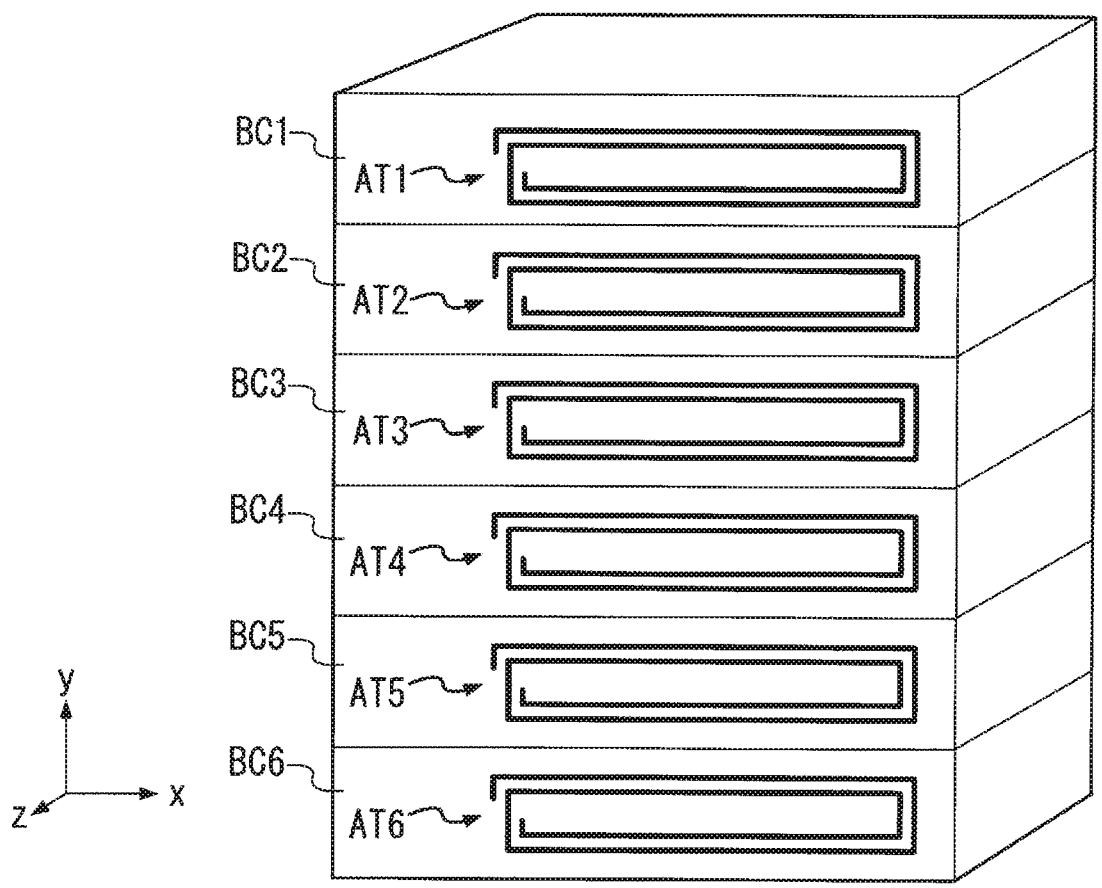
FIG. 6 is a perspective view showing another example of an aspect of coil antennas AT1 to AT6 formed on a surface of battery cells BC1 to BC6.

As shown in FIG. 6, for example, the coil antenna ATt may be formed on a side surface of the battery cell BCt corresponding to one of two long sides among the four sides of the top surface (or bottom surface) of the battery cell BCt (t being an integer of 1 to 6).

Figure 7:
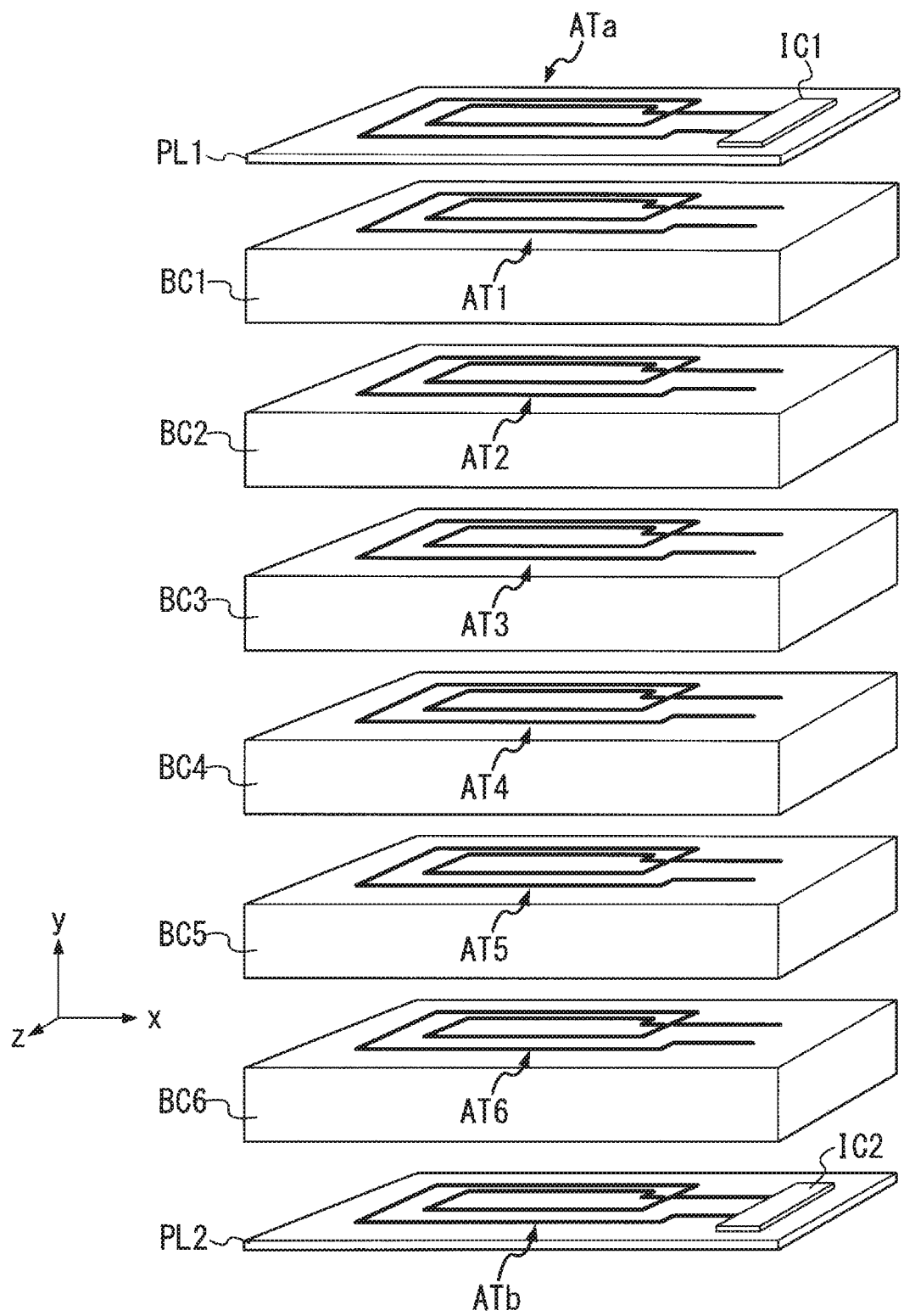
FIG. 7 is a perspective view showing another example of an aspect of coil antennas AT1 to AT6 formed on a surface of battery cells BC1 to BC6.

Also, as shown in FIG. 7, the coil antenna ATt may be formed on the top surface (or bottom surface) of the battery cell BCt (t being an integer of 1 to 6).

If the configuration shown in FIG. 7 is to be adopted, the substrate PL shown in FIG. 4 is split into a first substrate PL1 having formed on the surface thereof the semiconductor chip IC1 and the relay coil antenna ATa, and a second substrate PL2 having formed on the surface thereof the semiconductor chip IC2 and the relay coil antenna ATb. As shown in FIG. 7, the first substrate PL1 is disposed parallel to the top surface of the battery cell BC1 in a position opposing the top surface of the battery cell BC1, and the second substrate PL2 is disposed parallel to the bottom surface of the battery cell BC6 in a position opposing the bottom surface of the battery cell BC6. Furthermore, when adopting the configuration shown in FIG. 7, an insulating material is interposed between battery cells BC1-BC6 that are adjacent to each other.

In essence, if a flat coil antenna is to be formed on the surface of the battery cell BC, which has a rectangular cuboid shape, then the axial directions of the coil antenna are three directions: the x axis, y axis, and z axis. The antennas are disposed such that the axial direction of the all of the coil antennas AT1 to AT6, ATa, and ATb matches any one of the three axial directions.

For example, the axial direction of the coil antennas AT1 to AT6, ATa, and ATb are all in the x axis direction in the example shown in FIG. 4, the z axis direction in the example shown in FIG. 6, and the y axis direction in the example shown in FIG. 7.

By setting the axial directions of all of the coil antennas to be the same, it is possible to ensure a coupling coefficient for magnetic field coupling that allows for wireless communication. The most optimal configuration among FIGS. 4, 6, and 7 is adopted according to the shape of the battery cells BC1 to BCn, and the size, shape, and the like of the battery pack 10.

As shown in FIGS. 4, 6, and 7, by forming the flat coil antennas AT1 to ATn on the side surface, top surface, or bottom surface of the battery cells BC1 to BCn, it is possible to eliminate protrusions from the surface of the battery cells BC. This facilitates transportation of the battery cells BC1 to BCn, housing of the battery cells in the battery pack 10, and replacing the battery cells. Furthermore, since there are no protrusions on the surface of the battery cells BC, it is possible to reduce the size of the battery pack 10 that houses the battery cells BC.

The shape of the battery cells BC is not limited to being a rectangular cuboid, and may, for example, be trapezoidal, or the side surface, top surface, or bottom surface may be curved. The shape of coil antennas AT1 to ATn should be appropriately changed according to the shape of the surfaces of the battery cells BC, and formed thereon.

Figure 8:
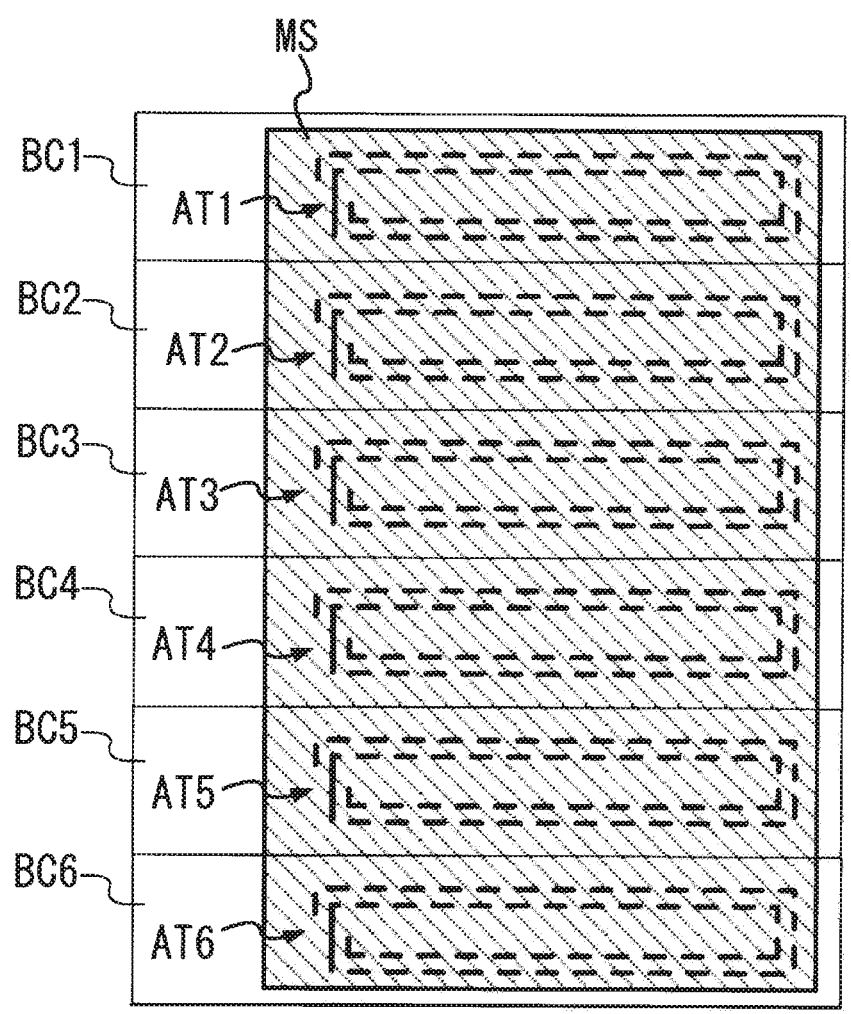
FIG. 8 is a front view showing an aspect of a formation surface for the coil antennas AT1 to AT6 on the battery cells BC1 to BC6 for a case in which the coil antennas AT1 to AT6 formed on the surface of the battery cells BC1 to BC6 are covered by a magnetic sheet MS.

Also, as shown in FIG. 8, for example, the surface of the flat coil antennas AT1 to AT6, which are formed on the respective surfaces of the battery cells BC1 to BC6, may be covered by a magnetic sheet MS with a magnetic permeability of 50 or greater and a thickness of approximately 0.2 millimeters, for example.

As a result, the lines of magnetic force emitted by the coil antennas AT1 to AT6, pass through the magnetic sheet MS in a concentrated manner, thereby increasing the coupling coefficient between the coil antennas. Thus, it is possible to increase the communication distance or to reduce the power necessary for communication. Also, by providing the magnetic sheet MS, it is possible to block interference from the outside.

The magnetic sheet MS may be made of a magnetic adhesive tape that is belt-shaped or that can be attached and removed.

Figure 9:
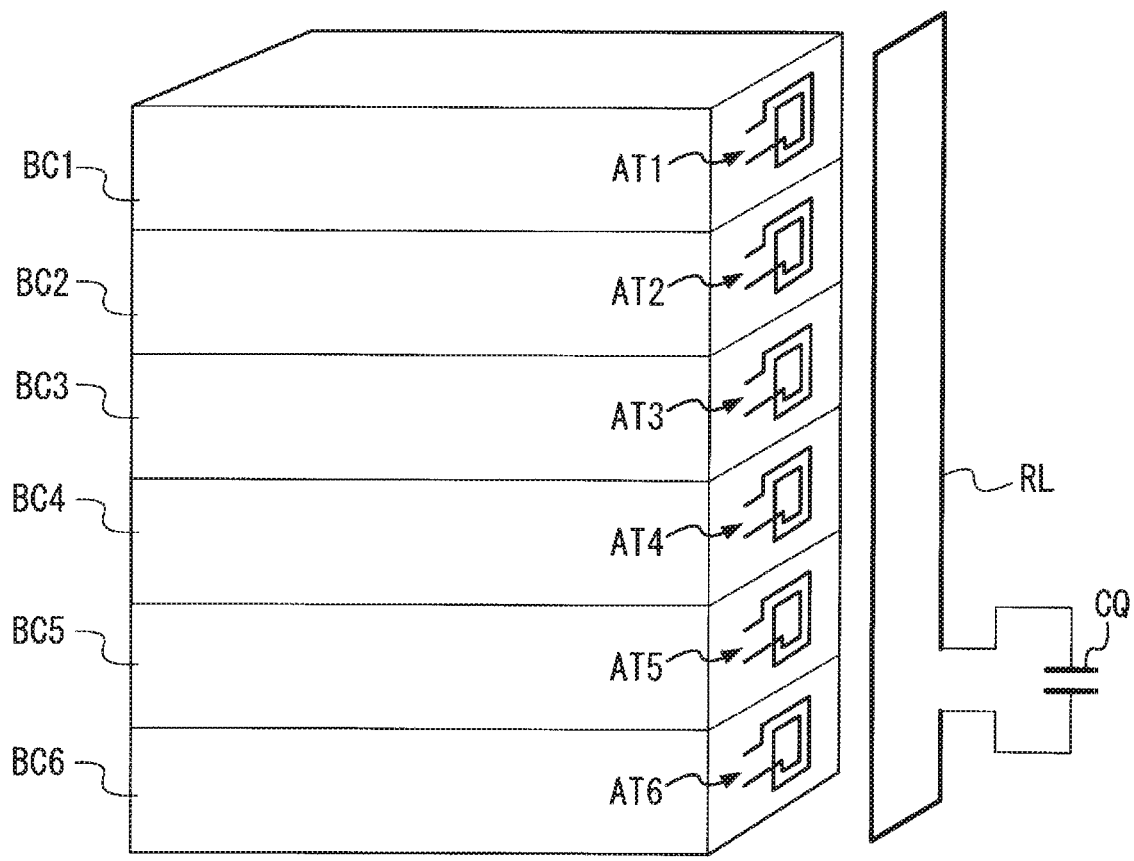
FIG. 9 is a perspective view showing an example of an aspect of a relay coil RL and the battery cells BC1 to BC6 on which the coil antennas AT1 to AT6 are formed.

Also, a ring-shaped relay coil RL such as that shown in FIG. 9 may be disposed, instead of the magnetic sheet MS, in a position opposing the surfaces of the battery cells BC1 to BC6 on which the coil antennas AT1 to AT6 are formed. The relay coil RL is connected to a capacitor CQ that sets the resonant frequency thereof to approximately 13.56 MHz, which is the frequency of the carrier wave signal used for wireless communication between the battery measurement unit 20 and the relay unit 30. The capacitor CQ may be a chip capacitor, for example, or a capacitor that uses the capacitance between two opposing electrodes.

In the configuration shown in FIG. 9, when wireless communication by magnetic field coupling of the battery measurement unit 20 and the relay unit 30 is performed, high frequency magnetic fields emitted by the coil antennas AT1 to ATn induce a high frequency current in the relay coil RL. In other words, as a result of the resonance circuit constituted of the relay coil RL and the capacitor CQ, a high frequency current also flows in the relay coil RL, which then emits a high frequency magnetic field. Thus, the high frequency magnetic field emitted from the relay coil RL is conveyed to the relay coil antennas ATa and ATb on the relay unit 30 side.

Thus, by providing the relay coil RL shown in FIG. 9, it is possible to increase the wireless communication distance. The relay coil RL is not connected to any active elements that would require electrical power. Furthermore, the relay coil RL can be a metal wiring line formed in a loop, a belt-shaped metal material, or the like, and thus, it is possible to increase the wireless communication distance without an increase in power consumption or device size.

Figure 10:
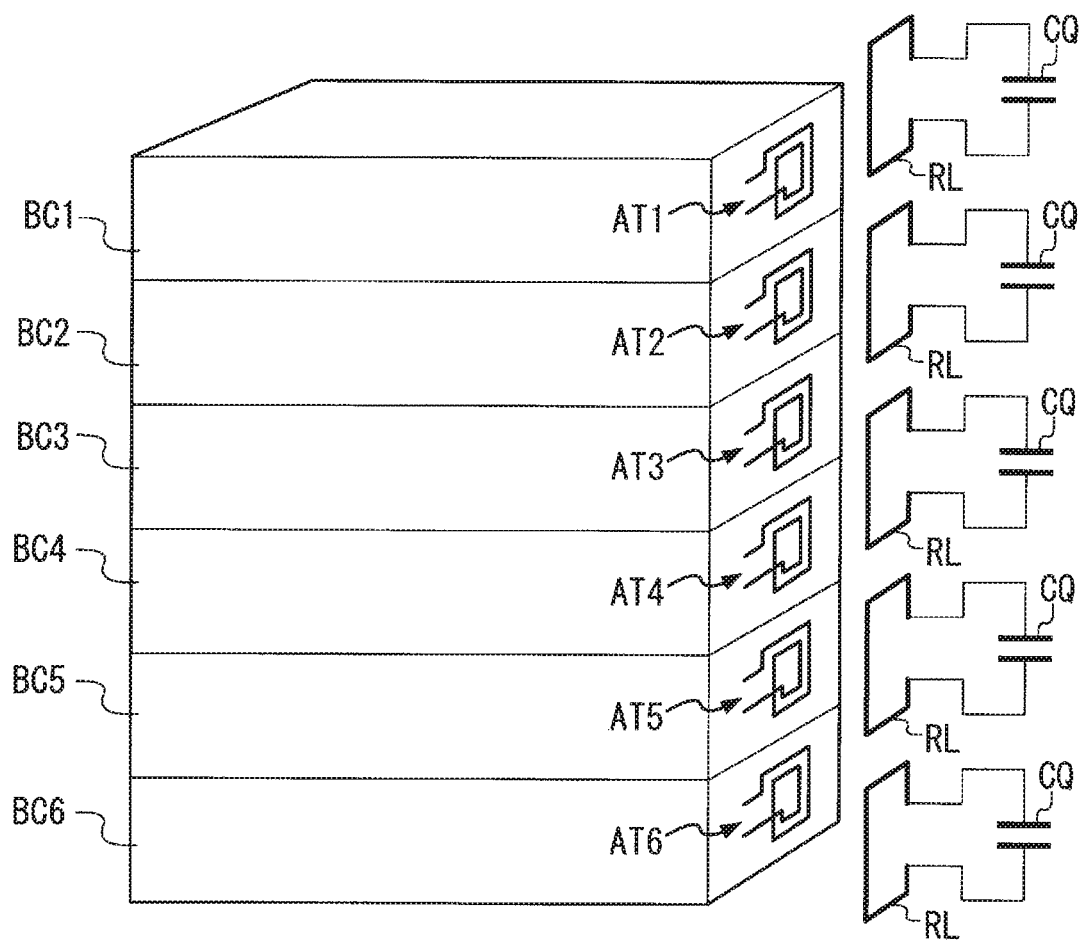
FIG. 10 is a perspective view showing another example of an aspect of a plurality of relay coils RL and the battery cells BC1 to BC6 on which the coil antennas AT1 to AT6 are formed.

Also, in the example shown in FIG. 9, only one relay coil RL is disposed in a position opposing the surface on which the coil antennas AT1 to AT6 are formed to a size and shape so as to cover the entire region of the coil antennas AT1 to AT6, but a plurality of relay coils RL may be aligned as shown in FIG. 10.

The capacitor CQ for the resonance circuit shown in FIGS. 9 and 10 may be omitted, and the relay coil RL and the magnetic sheet MS that is shown in FIG. 8 may be used in combination.

In order to drive the driving motor of an electric or hybrid vehicle, a voltage of several hundred volts is required, and thus, the size of the battery pack 10 becomes large enough to have an impact on the interior space of the vehicle.

One possible countermeasure is to split the battery pack 10 into a plurality of battery packs to reduce the size of each battery pack, and to dispose the battery packs in various different locations in the vehicle.

Figure 11:
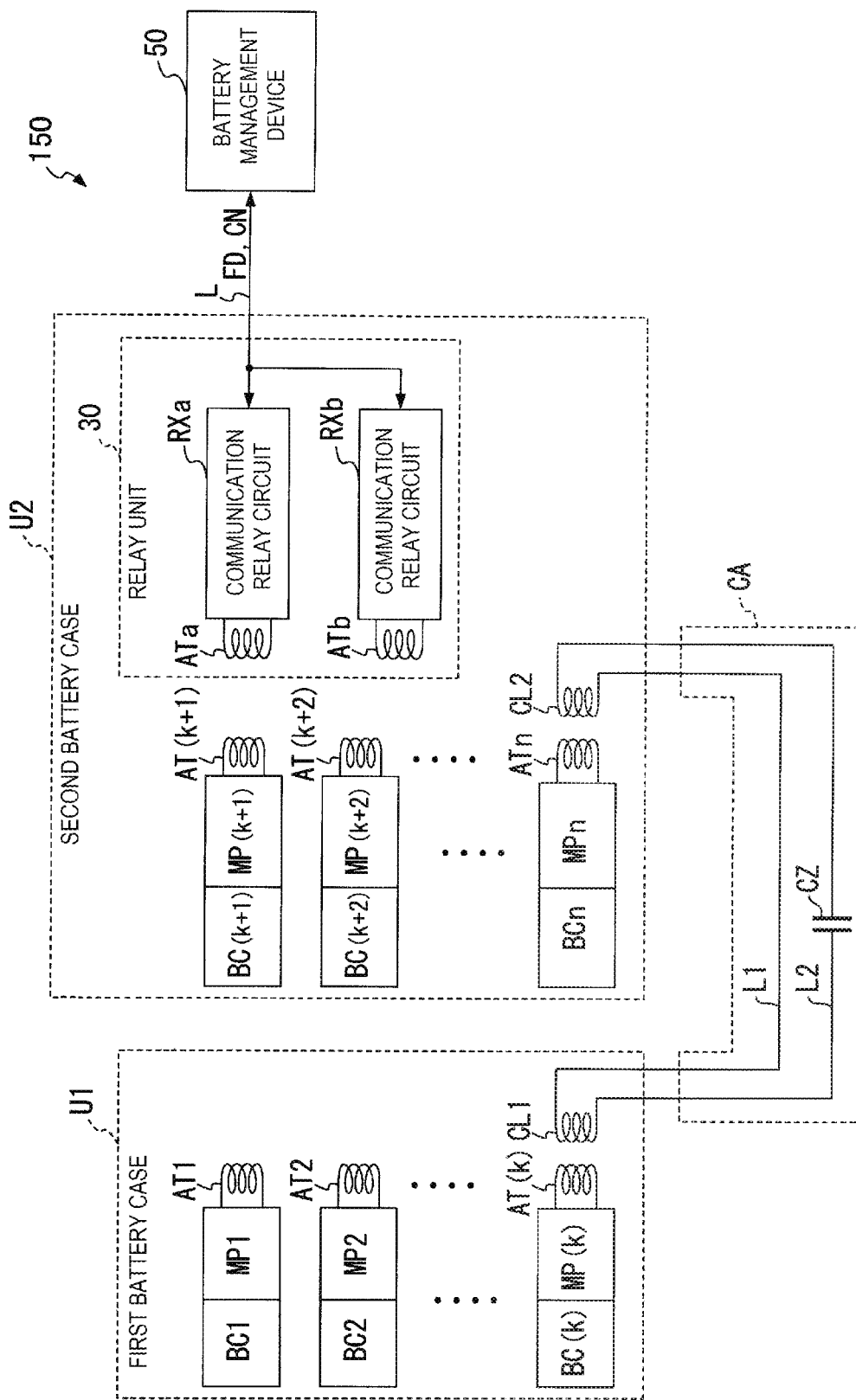
FIG. 11 is a block diagram showing another configuration of the battery monitoring system 150.

FIG. 11 is a block diagram showing a modification example of the battery monitoring system 150 that takes into consideration this issue.

The battery monitoring system 150 shown in FIG. 11 has a first battery case U1, a second battery case U2, a transmission cable CA, and a battery management device 50.

In the battery monitoring system 150 shown in FIG. 11, among the battery cells BC1 to BCn shown in FIG. 1, the battery cells BC1 to BCk (k being an integer less than n) are housed in the battery case U1, and the remaining battery cells BC(k+1) to BCn are housed in the battery case U2.

The battery case U1 is, for example, disposed below the rear seats of the vehicle, and the battery case U2 is disposed below the floor of the trunk of the vehicle, for example.

The battery case U1 houses the battery cells BC1 to BCk, as well as measurement/communication circuits MP1 to MPk and coil antennas AT1 to ATk corresponding to the battery cells BC1 to BCk. Additionally, the battery case U1 has disposed therein a coil CL1 that is arranged such that the axial direction thereof matches the axial direction of the coil antennas AT1 to ATk.

The battery case U2 houses the battery cells BC(k+1) to BCn, as well as measurement/communication circuits MP(k+1) to MPn and coil antennas AT(k+1) to ATn corresponding to the battery cells BC(k+1) to BCn. Additionally, the battery case U2 houses therein a coil CL2 that is arranged such that the axial direction thereof matches the axial direction of the coil antennas AT(k+1) to ATn, and the relay unit 30 shown in FIG. 1.

The operations of the relay unit 30 and the battery management device 50 are the same as those shown in FIG. 1, and thus, explanations thereof are omitted.

The battery case U1 and the battery case U2 are connected by the transmission cable CA. The transmission cable CA includes a wiring line L1, and a wiring line L2 that is connected in series to a capacitor CZ.

That is, one end of the coil CL1 included in the battery case U1 and one end of the coil CL2 included in the battery case U2 are electrically connected to each other by the wiring line L1 of the transmission cable CA. Additionally, the other end of the coil CL1 and the other end of the coil CL2 are connected to the wiring line L2 via the capacitor CZ.

As a result of the transmission path including the transmission cable CA and the coils CL1 and CL2, in the battery case U1 the high frequency magnetic field corresponding to the measurement information signal emitted by the coil antennas AT1 to ATk is first converted to a high frequency current by the coil CL1. At this time, the high frequency current is supplied to the coil CL2 included in the battery case U2 via the transmission cable CA. As a result, the coil CL2 emits a high frequency magnetic field corresponding to the high frequency current into the battery case U2. Thus, the relay unit 30 included in the battery case U2 acquires the measurement information signal representing the measurement results from measurements in the battery case U1 by magnetic field coupling with the coil CL2.

In the embodiment above, ASK, FSK, or PSK is used as the modulation mode for wireless communication between the battery measurement unit 20 and the relay unit 30, but QAM (quadrature amplitude modulation) or OFDM (orthogonal frequency-division multiplexing), which combines these modes, may be adopted. Also, a Manchester code or spread code may additionally be used.

In the embodiment above, as shown in FIGS. 2 and 3, the measurement/communication circuits MP1 to MPn and the communication relay circuits RXa and RXb each include an amplifier circuit (205A, 304A) and a filter (205B, 304B). Using such amplifier circuits and filters, it is possible to eliminated unwanted noise and interference, and to improve reception sensitivity and performance by using the amplifier circuits and filters as a superheterodyne receiver.

However, if a desired reception sensitivity can be attained even without elimination of unwanted noise and interference, the amplifier circuits (205A, 304A) and filters (205B, 304B) may be omitted. That is, signals received by the coil antennas (AT1 to ATn, ATa, ATb) are directly supplied to the detection/demodulation circuits (205C, 304C).

Also, a comparator or A/D converter may be used as the detection/demodulation circuits (205C, 304C).

If ASK is adopted as the modulation mode for wireless communication between the battery measurement unit 20 and the relay unit 30, then a configuration may be adopted in which a power amplifier circuit is used as the modulation circuits (204A, 303A) shown in FIGS. 2 and 3, and the gain is increased and decreased so as to increase and decrease the amplitude of the output, thereby realizing ASK. Also, a D/A converter may be used as the modulation circuit to generate the waveform of the modulation signal. Alternatively, an upconverter may be used as the modulation circuit.

If FSK or PSK is used as the modulation mode, then a PLL (phase-locked loop) circuit may be used as the modulation circuits (204A, 303A).

The measurement/communication circuits MP1 to MPn of the embodiment receive power supply individually from each of the connected battery cells BC, and are also individually provided with oscillation circuits that oscillate a crystal oscillator or the like, thereby generating a clock signal.

However, the measurement/communication circuits MP1 to MPn may be provided with a passive operation mode by which the measurement/communication circuits use a high frequency magnetic field to receive both electrical power and a synchronizing signal to be a reference for the clock signal, or either one of electrical power and a synchronizing signal. During passive operation mode, a load modulation circuit that issues a reply to communications may be provided in each of the measurement/communication circuits MP1 to MPn.

Also, a configuration may be adopted in which another oscillation circuit for generating a low speed clock signal is provided in each of the measurement/communication circuits MP1 to MPn, and intermittent operations of measurement and communication are performed by timer control using a clock signal generated by the oscillation circuit. Additionally, power consumption may be reduced by synchronizing the measurement/communication circuits MP1 to MPn and the communication relay circuits RXa and RXb to perform wireless communication.

Also, in the embodiment above, two communication relay circuits RXa and RXb are provided as the relay unit 30, but either one of the communication relay circuits or three or more communication circuits may be provided.

One measurement/communication circuit MP is provided per battery cell BC, but the measurement operation of a plurality of battery cells BC and the communication operation with the relay unit 30 may be performed by one measurement/communication circuit MP. Alternatively, a redundant system provided in order to handle faults may be configured by connecting a plurality of measurement/communication circuits MP to each battery cell BC.

The magnetic field coupling (JDa to JDc) shown in FIG. 5 may take on a mesh shape or star shape, or alternatively, the reliability of the device may be increased by the adoption of a redundant configuration in which magnetic field coupling regions are doubled.

The magnetic sheet MS shown in FIG. 8 may have a belt shape, plate shape, or rod shape, or may sandwich the coil antennas.

The coil antennas AT1 to ATn, ATa, and ATb may be formed by winding a metal wiring line around a bobbin or core, or may be formed into a flat pattern on a resin insulator such as a printed circuit board or flexible substrate. If the coil antennas are formed in a flat pattern, the metal wiring line may be formed in a spiral, a circle, an ellipse, or a thin rectangle. Also, if a flat pattern is used for the coil antennas AT1 to ATn, ATa, and ATb, the magnetic sheet may be used to line the coil antennas.

In the example shown in FIGS. 2 and 3, a parallel resonance circuit in which a resonance capacitor is connected in parallel to the coil antennas (AT1 to ATn, ATa, ATb) is used, but a series resonance circuit in which a resonance capacitor is connected in series to the coil antennas may be separately provided. In such a case, a configuration enabling switching between the parallel resonance circuit and the series resonance circuit is used.

A configuration may be adopted in which a resonance capacitor in which the capacitance can be varied is used, with the resonant frequency being shifted by changing the capacitance while the coil antenna is not being used, and the capacitance is restored to its original value immediately prior to use of the coil antenna.

Also, a switching function for matching impedance during communication may be provided for each of the measurement/communication circuits MP1 to MPn and the communication relay circuits RXa and RXb.

Additionally, a low-pass filter may be provided in a stage after the amplifier circuits (205A, 304A) of each of the measurement/communication circuits MP1 to MPn and the communication relay circuits RXa and RXb. In such a case, a configuration may be adopted in which switching is performed between supplying a reception signal through the low-pass filter to the next stage filter (205B, 304B), and supplying the reception signal directly to the filter (205B, 304B) without passing through the low-pass filter.

DESCRIPTION OF REFERENCE CHARACTERS 10 battery pack
20 battery measurement unit
30 relay unit
50 battery management device
150 battery monitoring system
200, 300 power source circuit
202, 301 oscillation circuit
AT1-ATn coil antenna
ATa, ATb relay coil antenna
BC1-BCn battery cell
MP1-MPn measurement/communication circuit
RXa, RXb communication relay circuit
U1, U2 battery case

What is claimed is:

1. A battery measurement device, comprising:
an input terminal that receives a voltage of a secondary battery;
a measurement circuit that measures a voltage value of the voltage received by the input terminal and generates a measurement information signal representing measurement results;
a transmission unit that wirelessly transmits the measurement information signal;
a control circuit coupled to the measurement circuit and the transmission unit;
a reception unit coupled to an output of the transmission unit;
and
a power source circuit that generates a power source voltage having a prescribed voltage value on the basis of the voltage received by the input terminal, and supplies the power source voltage to the measurement circuit and the transmission unit;
wherein the reception unit includes
an amplifier circuit coupled to an output of the transmission unit, and configured to amplify the measurement information signal transmitted by the transmission unit,
a filter coupled to an output of the amplifier circuit, and configured to reduce at least one of noise or interference in the amplified measurement information signal, and
a detection/modulation circuit coupled to an output of the filter, and configured to perform at least one of envelope detection or demodulation of the amplified and filtered measurement information signal to generate a control information signal;
the reception unit is configured to supply the control information signal to the control circuit; and
the control circuit is configured to supply a measurement command based on the control information signal to the measurement circuit to measure the voltage.

2. The battery measurement device according to claim 1, wherein the transmission unit includes a coil antenna that emits a high frequency magnetic field corresponding to the measurement information signal.

3. The battery measurement device according to claim 2, further comprising:
an oscillation circuit that generates an oscillation signal that oscillates in response to the power source voltage and generates a clock signal on the basis of the oscillation signal,
wherein the transmission unit includes:
a modulation circuit that generates a carrier wave signal synchronized to the clock signal and generates a modulation signal generated by modulating the carrier wave signal using the measurement information signal; and
a driver circuit that supplies to the coil antenna a signal generated by amplifying the modulation signal.

4. The battery measurement device according to claim 3, wherein a modulation mode of the modulation circuit is ASK (amplitude-shift keying), FSK (frequency-shift keying), PSK (phase-shift keying), QAM (quadrature amplitude modulation), or OFDM (orthogonal frequency-division multiplexing).

5. The battery measurement device according to claim 4, wherein the coil antenna has a flat spiral pattern and is formed on a surface of the secondary battery.

6. A battery measurement device, comprising:
an input terminal that receives a voltage of a secondary battery;
a measurement circuit that measures a voltage value of the voltage received by the input terminal and generates a measurement information signal representing measurement results;
a transmission unit that wirelessly transmits the measurement information signal;
a power source circuit that generates a power source voltage having a prescribed voltage value on the basis of the voltage received by the input terminal, and supplies the power source voltage to the measurement circuit and the transmission unit; and
an oscillation circuit that generates an oscillation signal that oscillates in response to the power source voltage and generates a clock signal on the basis of the oscillation signal,
wherein the transmission unit includes:
a coil antenna that emits a high frequency magnetic field corresponding to the measurement information signal;
a modulation circuit that generates a carrier wave signal synchronized to the clock signal and generates a modulation signal generated by modulating the carrier wave signal using the measurement information signal; and
a driver circuit that supplies to the coil antenna a signal generated by amplifying the modulation signal;
wherein a modulation mode of the modulation circuit is ASK (amplitude-shift keying), FSK (frequency-shift keying), PSK (phase-shift keying), QAM (quadrature amplitude modulation), or OFDM (orthogonal frequency-division multiplexing),
wherein the coil antenna has a flat spiral pattern and is formed on a surface of the secondary battery, and
wherein a magnetic sheet is disposed on a position facing the surface of the secondary battery where the coil antenna is formed, thereby covering the coil antenna.

7. The battery measurement device according to claim 6, wherein at least one relay coil in which a metal wiring line is formed in a loop is disposed on a position facing the surface of the secondary battery where the coil antenna is formed.

8. The battery measurement device according to claim 7, wherein the relay coil is connected to a resonance capacitor.

9. A battery monitoring system, comprising:
a battery management device that monitors a state of first to nth (n being an integer of 2 or greater) secondary batteries that are connected in series;
first to nth measurement and communication circuits that measure voltage values of the first to nth secondary batteries, generate first to nth measurement information signals individually representing measurement results, and generate first to nth modulation signals corresponding to the first to nth measurement information signals;
first to nth coil antennas that emit high frequency magnetic fields corresponding to each of the first to nth modulation signals;
relay coil antennas that receive high frequency magnetic fields and attain reception signals corresponding to the first to nth modulation signals; and
a communication relay circuit that acquires the first to nth measurement information signals from the reception signals and supplies the first to nth measurement information signals to the battery management device,
wherein each of the measurement and communication circuits has:
an input terminal that receives a voltage of the secondary battery;
a measurement circuit that measures a voltage value of the voltage received by the input terminal, and generates the measurement information signal representing measurement results;
a transmission unit that generates the modulation signal generated by modulating a carrier wave signal using the measurement information signal; and
a first power source circuit that generates a first power source voltage having a prescribed voltage value on the basis of the voltage of the input terminal, and supplies the first power source voltage to the measurement circuit and the transmission unit.

10. The battery monitoring system according to claim 9, wherein the communication relay circuit has:

an amplifier circuit that amplifies the reception signal and generates an amplified reception signal;

an active filter that outputs a signal generated by eliminating noise and interference from the amplified reception signal;

a demodulation circuit that acquires the first to nth measurement information signals by applying a demodulation process on the signal outputted from the active filter; and a second power source circuit that receives an external voltage and generates a second power source voltage having a prescribed voltage value on the basis of the external voltage, and supplies the second power source voltage to the amplifier circuit, the active filter, and the demodulation circuit.

11. The battery monitoring system according to claim 9, wherein the relay coil antennas are each disposed in positions where at least one coil antenna among the first to nth coil antennas undergoes magnetic field coupling with the relay coil antenna, and wherein by the magnetic field coupling between the plurality of coil antennas including the at least one coil antenna, wireless communication between the plurality of measurement/communication circuits connected to the plurality of coil antennas is performed.

12. The battery monitoring system according to claim 11, comprising:

a first battery case that houses first to kth (k being an integer less than n) secondary batteries among the first to nth secondary batteries, first to kth said measurement/communication circuits connected to the first to kth secondary batteries, first to kth said coil antennas connected to the first to kth measurement/communication circuits, and a first coil having a same axial direction as the first to kth coil antennas;

a second battery case that houses k+1th to nth secondary batteries among the first to nth secondary batteries, k+1th to nth said measurement/communication circuits connected to the k+1th to nth secondary batteries, k+1th to nth said coil antennas connected to the k+1th to nth measurement/communication circuits, a second coil having a same axial direction as the k+1th to nth coil antennas, the relay coil antennas, and the communication relay circuit; and a transmission cable that connects both ends of the first coil housed in the first battery case to both ends of the second coil housed in the second battery case.

* * * * *